United States Patent
Ho et al.

(10) Patent No.: US 7,352,613 B2
(45) Date of Patent: Apr. 1, 2008

(54) MAGNETIC MEMORY DEVICE AND METHODS FOR MAKING A MAGNETIC MEMORY DEVICE

(75) Inventors: ChiaHua Ho, Kaohsiung (TW); Kuang-Yeu Hsieh, Hsinchu (TW)

(73) Assignee: Macronix International Co., Ltd. (TW)

( * ) Notice: Subject to any disclaimer, the term of this patent is extended or adjusted under 35 U.S.C. 154(b) by 57 days.

(21) Appl. No.: 11/255,606

(22) Filed: Oct. 21, 2005

(65) Prior Publication Data

US 2007/0091668 A1    Apr. 26, 2007

(51) Int. Cl.
*G11C 11/00*    (2006.01)
(52) U.S. Cl. .................. 365/158; 365/171; 365/173
(58) Field of Classification Search .................. 365/158
See application file for complete search history.

(56) References Cited

U.S. PATENT DOCUMENTS

| | | | |
|---|---|---|---|
| 5,640,343 A | | 6/1997 | Gallagher et al. |
| 5,940,319 A | * | 8/1999 | Durlam et al. ............... 365/171 |
| 6,174,737 B1 | * | 1/2001 | Durlam et al. .................. 438/3 |
| 6,404,674 B1 | * | 6/2002 | Anthony et al. ............. 365/173 |
| 6,545,906 B1 | | 4/2003 | Savtchenko et al. |
| 6,740,947 B1 | * | 5/2004 | Bhattacharyya et al. .... 257/421 |
| 6,845,038 B1 | * | 1/2005 | Shukh ......... 365/171 |
| 6,944,053 B2 | * | 9/2005 | Anthony et al. ............. 365/173 |
| 7,020,009 B2 | * | 3/2006 | Ho et al. ...................... 365/158 |
| 2006/0002183 A1 | * | 1/2006 | Anthony et al. ............. 365/158 |

* cited by examiner

*Primary Examiner*—Son L. Mai
(74) *Attorney, Agent, or Firm*—Baker & McKenzie LLP (57) ABSTRACT

A nonvolatile memory device is disclosed. The device includes a substrate, at least one relatively high permeability conductive line, and at least one magnetoresistive memory cell separated from the at least one relatively high permeability conductive line by an insulating material and located in a region of a magnetic field induced in the relatively high permeability conductive line. Methods of making such devices are also disclosed.

28 Claims, 10 Drawing Sheets

MAGNETIC MEMORY DEVICE AND METHODS FOR MAKING A MAGNETIC MEMORY DEVICE

RELATED APPLICATION INFORMATION

This application is related to co-pending U.S. patent application Ser. No. 11/281,018, entitled, "Systems and Methods for a Magnetic Memory Device that Includes Two Word Line Transistor," filed Nov. 17, 2005, U.S. patent application Ser. No. 11/281,658, entitled, "Systems and Methods for Reading and Writing a Magnetic Memory Device," filed Nov. 11, 2005, and U.S. patent application Ser. No. 11/281,027, entitled, "Systems and Methods for a Magnetic Memory Device Comprising a Single Word Line Transistor," filed Nov. 17, 2005, each of which are incorporated herein in the entirety as if set forth in full.

BACKGROUND

1. Field of the Invention

The invention relates in general to memory devices for use as computer main storage, and in particular to memory arrays that use magnetic memory elements as the individual memory cells.

2. Background of the Invention

The desired characteristics of a memory cell for computer main memory are high speed, low power, nonvolatility, and low cost. Low cost is accomplished by a simple fabrication process and a small surface area. Dynamic random access memory (DRAM) cells are fast and expend little power, but have to be refreshed many times each second and require complex structures to incorporate a capacitor in each cell. Flash type EEPROM cells are nonvolatile, have low sensing power, and can be constructed as a single device, but take microseconds to write and milliseconds to erase, which makes them too slow for many applications, especially for use in computer main memory. Conventional semiconductor memory cells such as DRAM, ROM, and EEPROM have current flow in the plane of the cell, i.e., "horizontal", and therefore occupy a total surface area that is the sum of the essential memory cell area plus the area for the electrical contact regions, and therefore do not achieve the theoretical minimum cell area.

Unlike DRAM, magnetic memory cells that store information as the orientation of magnetization of a ferromagnetic region can hold stored information for long periods of time, and are thus nonvolatile. Certain types of magnetic memory cells that use the magnetic state to alter the electrical resistance of the materials near the ferromagnetic region are collectively known as magnetoresistive (MR) memory cells. An array of magnetic memory cells is often called magnetic RAM or MRAM.

To be commercially practical MRAM should have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, three problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and error rate of the MRAM device and unintended reversals can occur due to thermofluctuations (superparamagnetism) if the barrier is too small. A major problem with having a small energy barrier is that it becomes extremely difficult to selectively switch one MRAM device in an array. Selectability allows switching without inadvertently switching other MRAM devices. Finally, because the switching field is produced by shape, the switching field becomes more sensitive to shape variations as the MRAM device decreases in size. With photolithography scaling becoming more difficult at smaller dimensions, MRAM devices will have difficulty maintaining tight switching distributions.

These problems often associated with conventional MRAM devices result in other problems. For example, it takes high currents in order to change the state of the magnetic sensing device in order to program a conventional MRAM device. These high currents create several problems including high power consumption which makes MRAM devices unsuitable for many portable applications. Moreover, the magnetic field resulting from the currents is often difficult to control which leads to cross talk problems especially in MRAM devices with decreased lateral dimensions as described above.

Another problem with conventional MRAM devices is that two current lines are typically required for generating the currents and associated magnetic field needed to program the magnetic sensing device included in the MRAM device. The inclusion of two current lines limits the ability to shrink the MRAM device and achieve the greatest possible densities in size reductions.

SUMMARY

A nonvolatile memory device is disclosed. The device includes a substrate, at least one relatively high permeability conductive line, and at least one magnetoresistive memory cell separated from the at least one relatively high permeability conductive line by a non-magnetically electrically conductive material and located in a region of a magnetic field induced in the relatively high permeability conductive line. Methods of making such devices are also disclosed.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

Figure 1A:
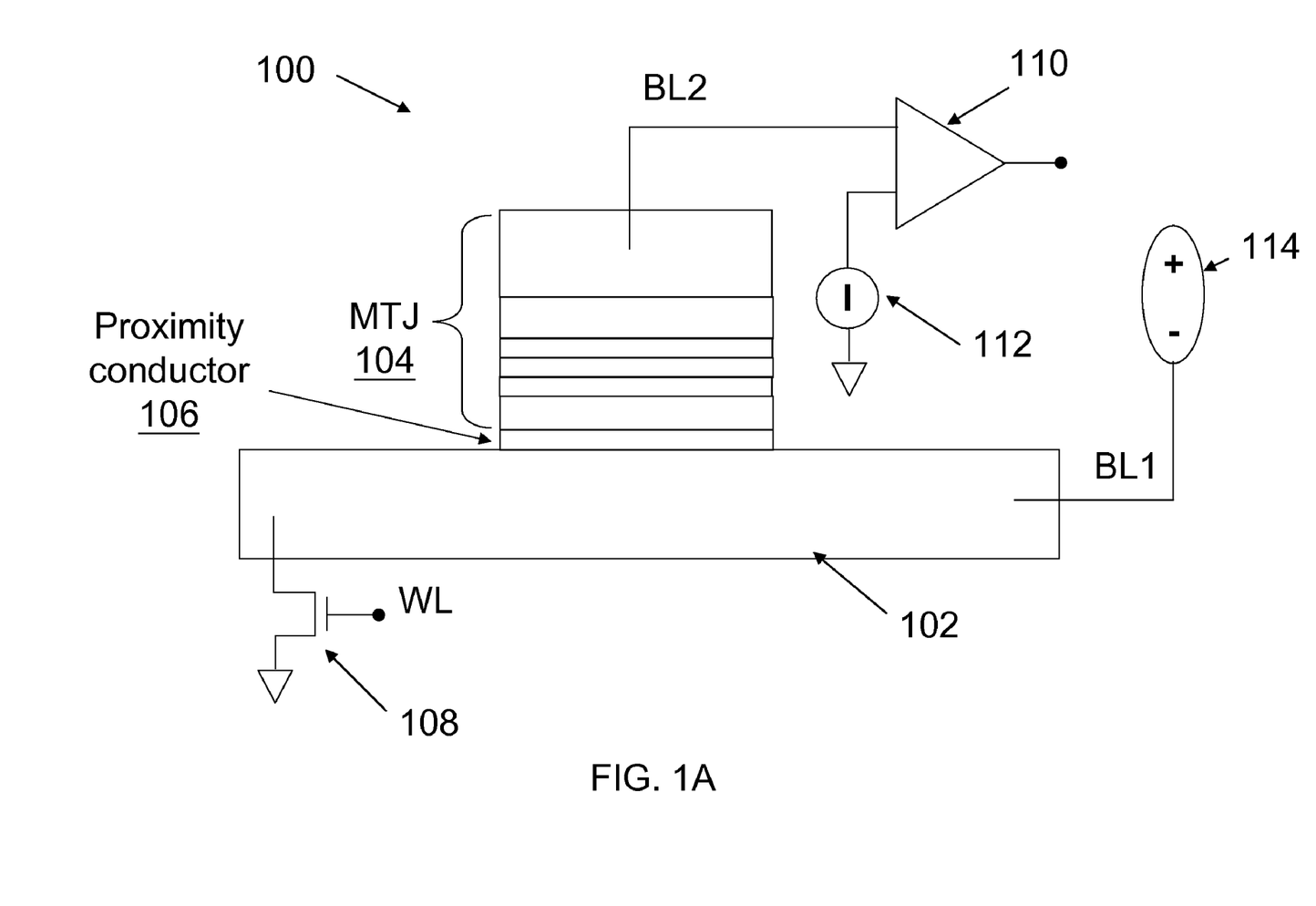
FIG. 1 is a diagram illustrating an example MRAM cell structure configured in accordance with one embodiment.

FIG. 1, comprising FIGS. 1A and 1B, is a diagram illustrating an example embodiment of an MRAM cell 100 that can be included in an MRAM device configured in accordance with one embodiment of the systems and methods described herein. It will be apparent that not all the layers, structures, and/or circuits included in MRAM cell 100, or the MRAM device in which MRAM cell 100 is included, are illustrated in FIG. 1. Only certain elements, layers, and/or aspects associated with MRAM cell 100 are shown in FIG. 1 for the sake of convenience. While not all of the layers, elements, and circuits associated with MRAM cell 100 are illustrated in FIG. 1, this should not be seen as limiting MRAM cell 100 to any particular construction or as excluding any of these various layers, elements, and/or circuits. Further, while the layers illustrated in FIG. 1 are shown in two dimensions, it will be clear that the layers are actually three-dimensional.

As can be seen, MRAM cell 100 includes a relatively high permeability conductive line, which can be referred to as magnetic metal layer 102, and a magnetoresistive memory cell, which can be referred to as magnetic sensing device 104, in close proximity to magnetic metal layer 102. Magnetic sensing device 104 is separated from magnetic metal layer 102 in certain embodiments, via a proximity conductor layer 106. Magnetic metal layer 102 can have an associated length, height, and width that can range anywhere from 10 nm to 10 μm. Similarly, magnetic sensing device 104 can have an associated length, height, and width that can range anywhere from 5 nm to 10 μm depending on the embodiment.

Magnetic metal layer 102 can have a permeability ($\mu$) in the range from about 10 to $10^8$. Magnetic metal layer 102 is conductive and has a resistivity ($\rho$) that ranges from about 4 μΩ-cm to $10^8$ μΩ-cm. Magnetic metal layer 102 can also have a saturation magnetization ($M_S$) that ranges from about 10 Guass to 2.5 Tesla. The material used to construct magnetic metal layer 102 can include at least one element with a crystallization phase. For example, magnetic metal layer 102 can include Ni, Fe, Co, B, Mo, Zn, Pb, Si, C, O, and/or any other material that can provide the $\rho$ and $M_S$ described above.

Proximity conductor 106 can be configured to connect magnetic sensing device 104 and magnetic metal layer 102. The resistivity ($\rho$) of proximity conductor 106 can be in the range of about 1 to $10^{10}$ μΩ-cm. Proximity conductor 106 can be metal, a conductive compound, semi-conductor material, or any other material that has a resistivity within the range described above. These materials can include, for example, Cu, TiN, TaN, Si, W, Ag, Ru, Ir, Pt, etc.

Magnetic sensing device 104 can include a single or multi-layer layer ferro/anti-ferro magnetic device. Such magnetic devices can include, for example, a Magnetic Tunnel Junction (MTJ) device, a Giant Magneto Resistance (GMR) device, a Colossal Magneto Resistance (CMR) device, or an Anisotropic Magneto Resistance (AMR) device, Magneto Optical (MO) element, or magnetic disc. For example, magnetic sensing device 104 can include an MTJ device comprising of a ferromagnetic layer, an insulator, another ferromagnetic layer, and an anti-ferromagnetic layer. Alternatively, magnetic sensing device 104 can include an MTJ device that includes a ferro magnetic layer, an insulator layer, and another ferromagnetic layer, or an MTJ device that includes an anti-ferromagnetic layer, a ferromagnetic layer, an insulator, and another ferro magnetic layer.

In other embodiments, magnetic sensing device 104 can include a GMR device that includes a ferromagnetic layer, a thin conductive layer, another ferromagnetic layer, and an anti-ferromagnetic layer. Alternative GMR devices that can be used in conjunction with the systems and methods described herein can include a ferromagnetic layer, a thin conductive layer, and another ferromagnetic layer, or an anti-ferromagnetic layer, a ferromagnetic layer, a thin conductive layer, and another ferromagnetic layer.

Alternatively, a CMR device comprising a Mn-based compound with at least two elements, such as LaSrMnO, PrCaMnO, LaCaMnO, etc., can be used for magnetic sensing device 104. In still other embodiments, an AMR device, MO elements, or a magnetic disc comprising 3d transition ferromagnetic elements or alloys with other elements can be used for magnetic sensing device 104.

The ferromagnetic layers referred to above can, depending on the embodiment, include 3d transition ferromagnetic elements or alloys with other elements such as CoFe, NiFe, CoFeB, Fe, Co, etc. The anti-ferromagnetic layers described above can include transition anti-ferromagnetic elements or alloys with other elements, such as FeMn, IrMn, NiO, PtMn, NiMn, CoO, etc. Other anti-ferromagnetic layers referred to above can include ferromagnetic anti-layers with or without anti-ferromagnetic material, such as CoFe/Ru/CoFe, CoFe/Ru/CoFe/IrMn, etc. Insulator layers referred to above can include elements such as Al2O3, MgO, etc., and the thin conductive layers described above, can include materials such as Cu. Ag, Cr, Ru, Ir, etc.

It will be understood that the devices, layers, and materials described above are by way of example only and should not be seen as limiting the systems and methods described herein to any particular device structure and/or materials. Further, the high permeability conductive element, or line can comprise a non-circular cross section. This allows the magnetic field to pass from one side of the high permeability element to the other. For example, the cross-sectional area can be polygon shape.

The magnetoresistive memory cell can then be located in a region between the neighboring two corners, or left and right edges of the high permeability conductive line.

As will be described in more detail below, magnetic metal layer 102 can be used to conduct currents that create magnetic fields that can be used to program magnetic sensing device 104 to one of two states. Further, magnetic metal layer 102 can be used to conduct currents that enable the state of magnetic sensing device 104 to be determined. By using magnetic layer 102 to conduct read and write currents in this manner, lower current levels can be used in the read and write operations as compared to conventional devices. Further, the low currents in magnetic layer 102 reduces and can even eliminate any cross talking problems. Moreover, the number of metal bit lines can be reduced relative to conventional MRAM devices, which allows for greater reduction in size and increase densities.

Figure 2:
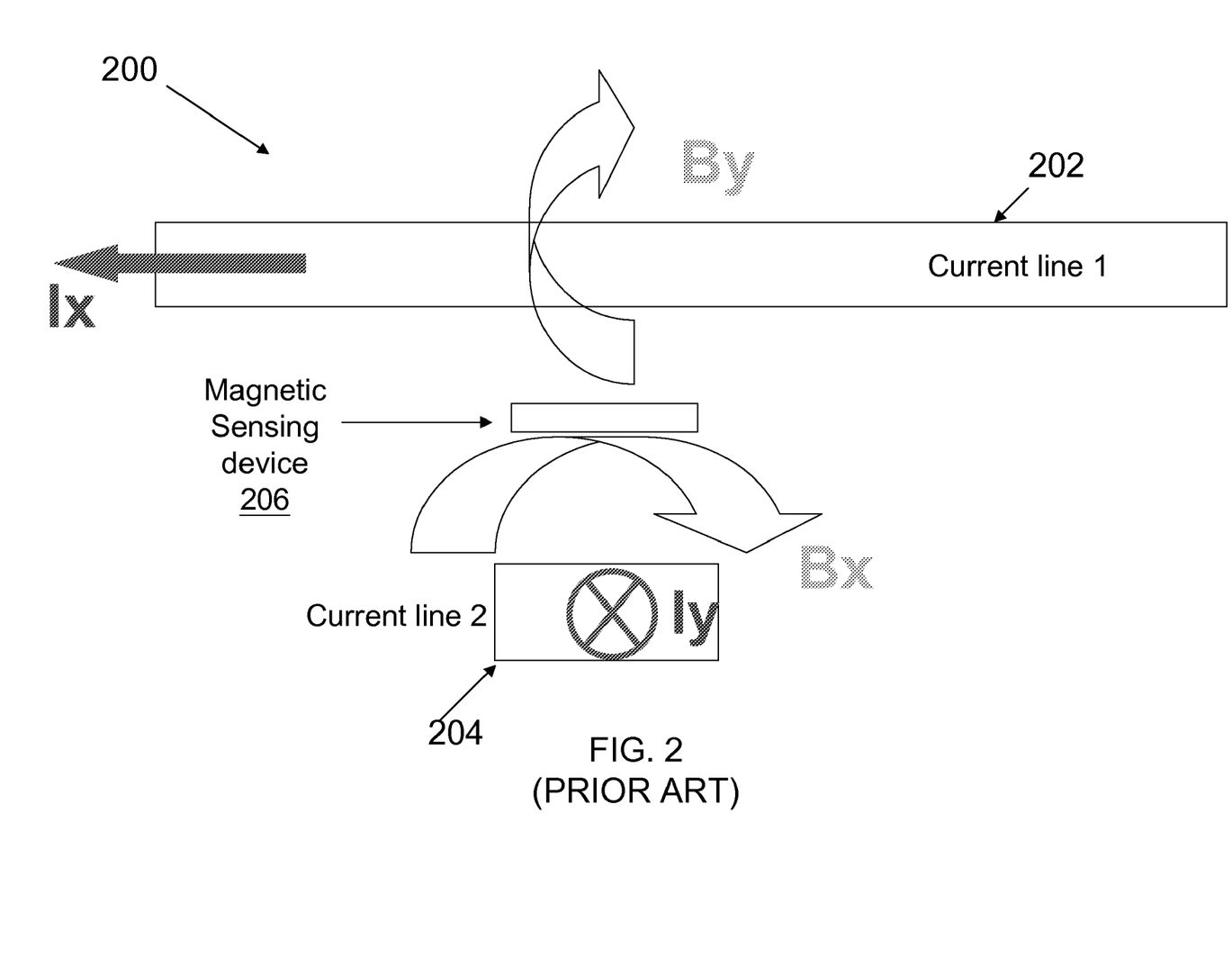
FIG. 2 is a diagram illustrating the current lines and magnetic sensing device for a conventional MRAM device of prior art.

FIG. 2 is a diagram illustrating the current lines 202 and 204 and magnetic sensing device 206 for an exemplary MRAM cell 200. As explained above, magnetic sensing device 206 comprises magnetic material that can be configured to store information as the orientation of the magnetization of a ferromagnetic region within magnetic sensing device 206. The orientation of the magnetization can be effected by magnetic fields By and Bx that result from current flowing through current lines 202 and 204.

Current lines 202 and 204 are typically constructed from non-magnetic materials, such as Cu. Magnetic fields By and Bx generated by currents Ix and Iy flowing through current lines 202 and 204 are generated in accordance with Ampere's law. If the sum of the magnetic fields (Bx+By) is greater than the coercive field of magnetic sensing device 206, then magnetic sensing device 206 can be programmed to one of two programming states.

For example, when currents Ix and Iy are flowing in the directions shown, i.e., from right to left and into the page, and the currents are sufficient magnitude such that Bx+By is greater than the coercive field of magnetic sensing device 206, then the magnetic moment vector for magnetic sensing device 206 can be switched to one of the two programming states. Reversal of the directions for currents Ix and Iy will then switch the magnetic moment vector in the other direction programming magnetic sensing device 206 to the other of the two programming states.

Unfortunately, in part because current lines 202 and 204 are constructed from non-magnetic materials, it takes large amounts of current, i.e., several mA to several tens of mA, to generate sufficient magnetic fields Bx and By to overcome the energy barrier from magnetic sensing device 206. Further, the distribution of magnetic fields By and Bx cannot be controlled sufficiently to avoid cross talk between cells.

Figure 3:
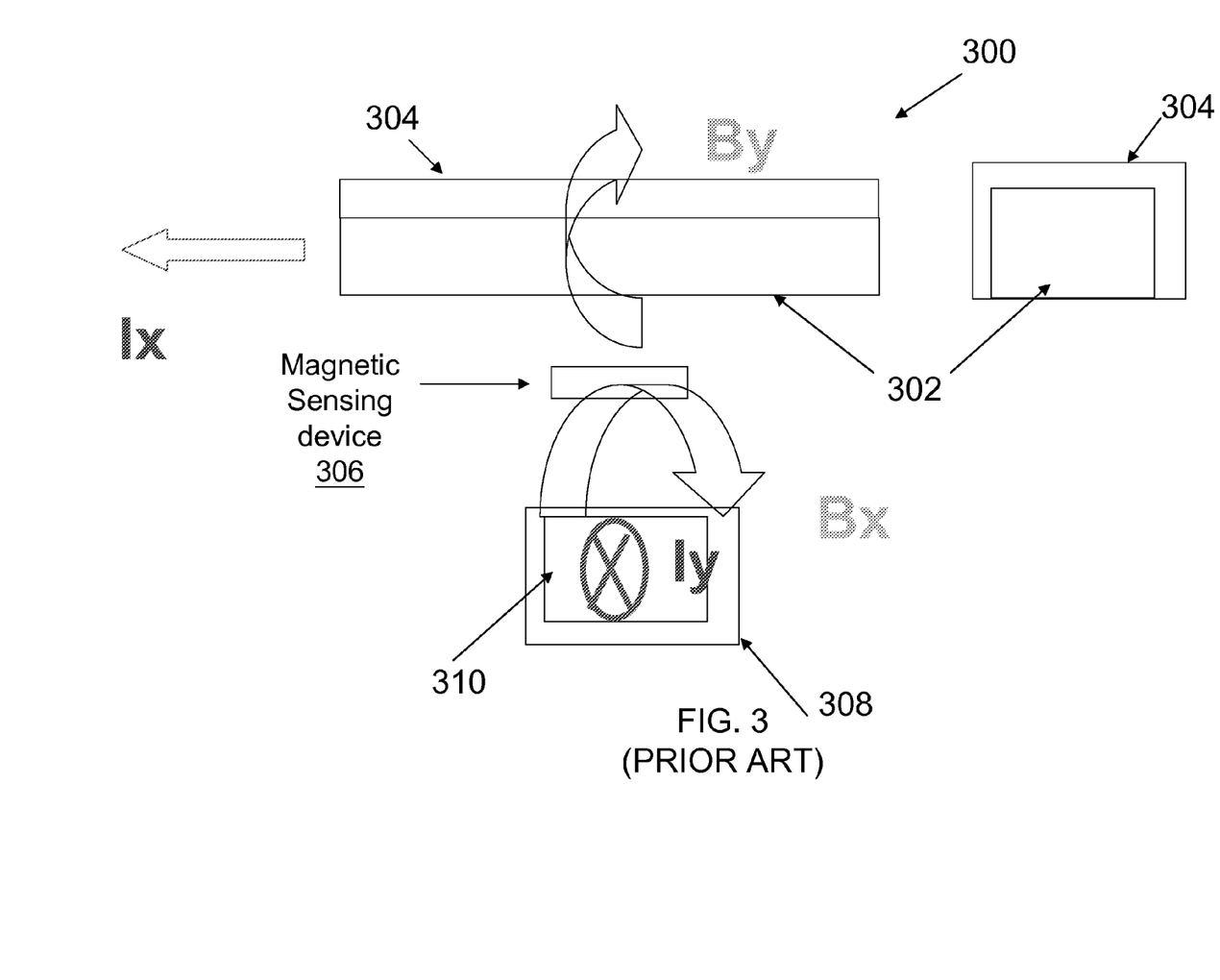
FIG. 3 is a diagram illustrating the current lines and magnetic sensing device for another conventional MRAM cell of prior art.

In the example of FIG. 3, which illustrates the current lines 302 and 310 and magnetic sensing device 306 for another exemplary MRAM cell, current lines 302 and 310 are surrounded by magnetic material 304 and 308. For current line 302 this is illustrated by the side view on the right of FIG. 3. MRAM cell 300 operates in the same fashion as MRAM cell 200; however, due to the resistivity (ρ) difference between current lines 302 and 310 and the magnetic material 304 and 308 surrounding current lines 302 and 310 respectively, most of the current Ix and Iy flows through the non-magnetic material of current lines 302 and 310. In addition, due to the confining operation of magnetic material 304 and 308, which can be referred to as magnetic clamps, the magnetic fields Bx and By generated by currents Ix and Iy respectively, are confined and the distribution is better controlled. Essentially, magnetic clamps 304 and 308 act as U-shaped magnets surrounding current lines 302 and 310. Thus, most of magnetic fields Bx and By are focused within clamps 304 and 308.

For the cell of FIG. 3, currents Ix and Iy, required to program magnetic sensing device 306 and MRAM cell 300, are less than those required for MRAM cell 200; however, several mA are still required. Problems with cross talking are also improved, but the device of FIG. 3 is more complicated to manufacture than that of FIG. 2.

Figure 4:
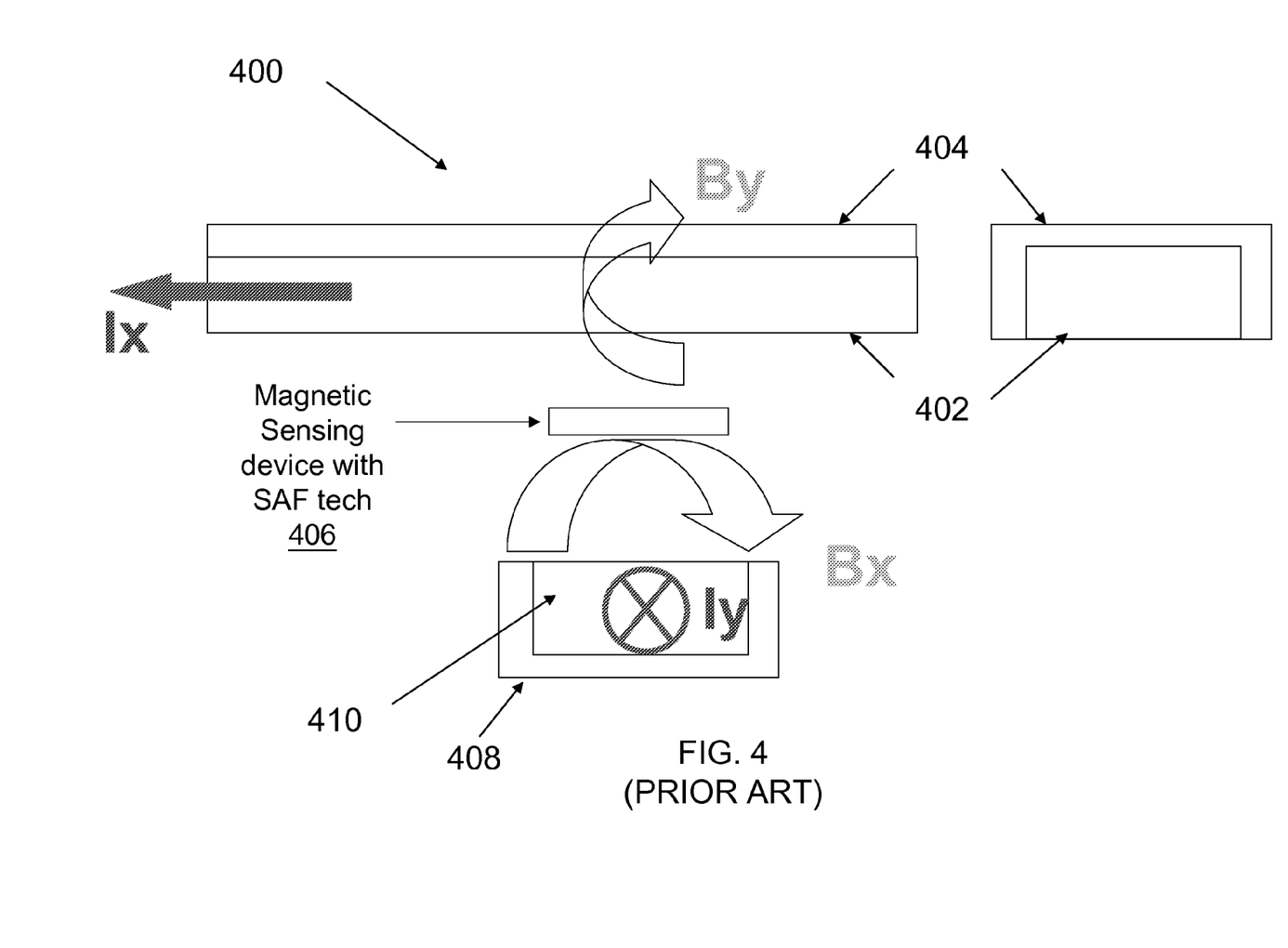
FIG. 4 is a diagram illustrating the current lines and magnetic sensing device for still another conventional MRAM cell of prior art.

FIG. 4 is a diagram illustrating the current lines 402 and 410 and magnetic sensing device 406 for still another exemplary MRAM cell 400. As with MRAM cell 300, current lines 402 and 410 are clamped by magnetic material 404 and 408. Here however magnetic sensing device 406 uses Synthetic Antiferromagnetic Coupling (SAF). In order to use SAF coupling, magnetic sensing device 406 is constructed from a plurality of layers. These layers include a first ferromagnetic layer, a very thin conductive layer, e.g., approximately 0.7 nm, and a second ferromagnetic layer. Further, currents Ix and Iy are pulsed on different time sequences. The differential pulsing switches the magnetization of the first and second ferromagnetic layers at different times. If the magnetization of both the first and the second ferromagnetic layers are switched then magnetic sensing device 406 is programmed to one of the two programming states. If the magnetization is not switched, then magnetic sensing device 406 remains programmed to its current state.

Use of SAF technology is effective for eliminating cross talk; however, very large currents are typically required to program magnetic sensing device 406. For example, several tens of mA are required in order to change the state of magnetic sensing device 406. In addition, the very thin conductive layer required for magnetic sensing device 406 can be very difficult to manufacture and control. If the thickness of the thin conductive layer varies too much, then the cell will not operate correctly.

Moreover, each of the cells illustrated in FIGS. 2-4 require two current lines to program the magnetic sensing device included therein. Conversely, in cell 100, only magnetic metal layer 102 is needed to program magnetic sensing device 104. Thus, one current line can be eliminated by implementing the structure illustrated in FIG. 1.

Figure 5:
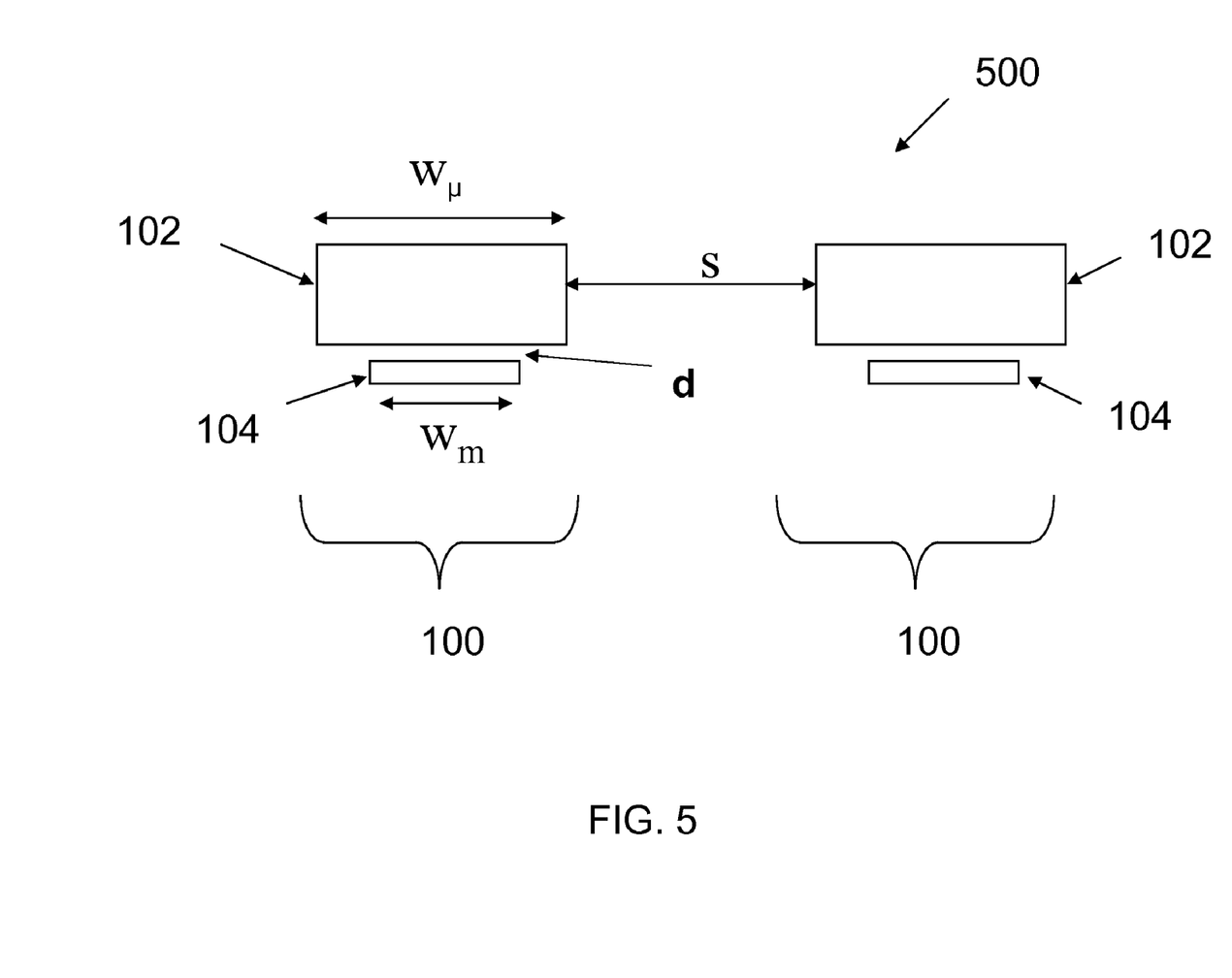
FIG. 5 is a diagram illustrating one embodiment of an MRAM device including MRAM cells, such as the MRAM cell of FIG. 1.

FIG. 5 is a diagram illustrating a side view of an MRAM device 500 comprising two exemplary MRAM cells 100. FIG. 5 illustrates some key dimensions related to MRAM cells 100 including the width ($W_\mu$) of magnetic metal layers 102, the width ($W_m$) of magnetic sensing device 104, the distance (d) between magnetic sensing device 104 and magnetic metal layer 102, and the spacing (S) between magnetic metal layers 102. Example ranges for (d) can be 4 nm to 100 nm. An example range for ($W_\mu$) can be 10 nm to 10 μm. And example range for ($W_m$) can be 5 nm to 10 cm. An example range for (s) can be 5 nm to 10 μm. It will be understood, however, that these ranges are by way of example only and that other ranges are possible.

Figure 6:
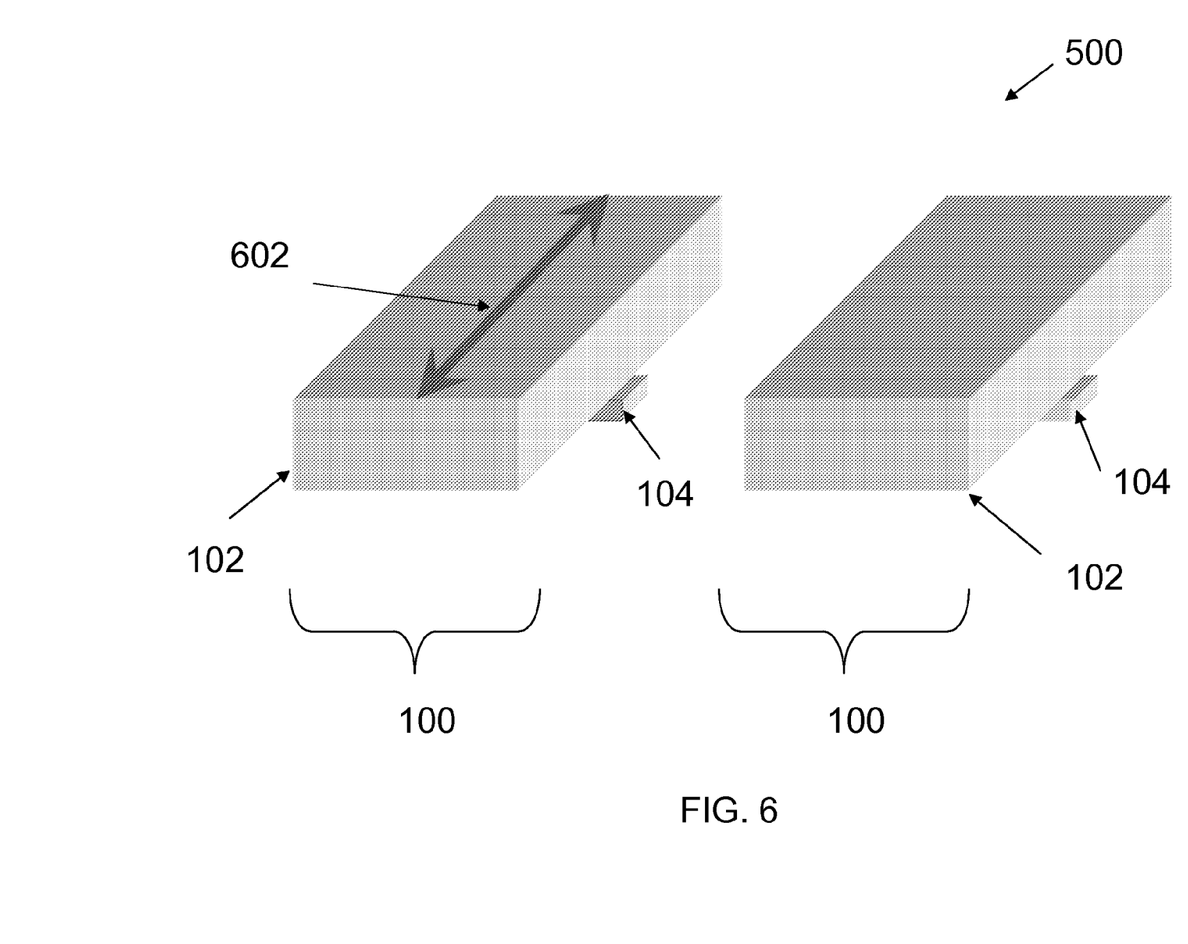
FIG. 6 is a diagram illustrating an exemplary writing current for the MRAM cells included in the MRAM device of FIG. 5.
Figure 7:
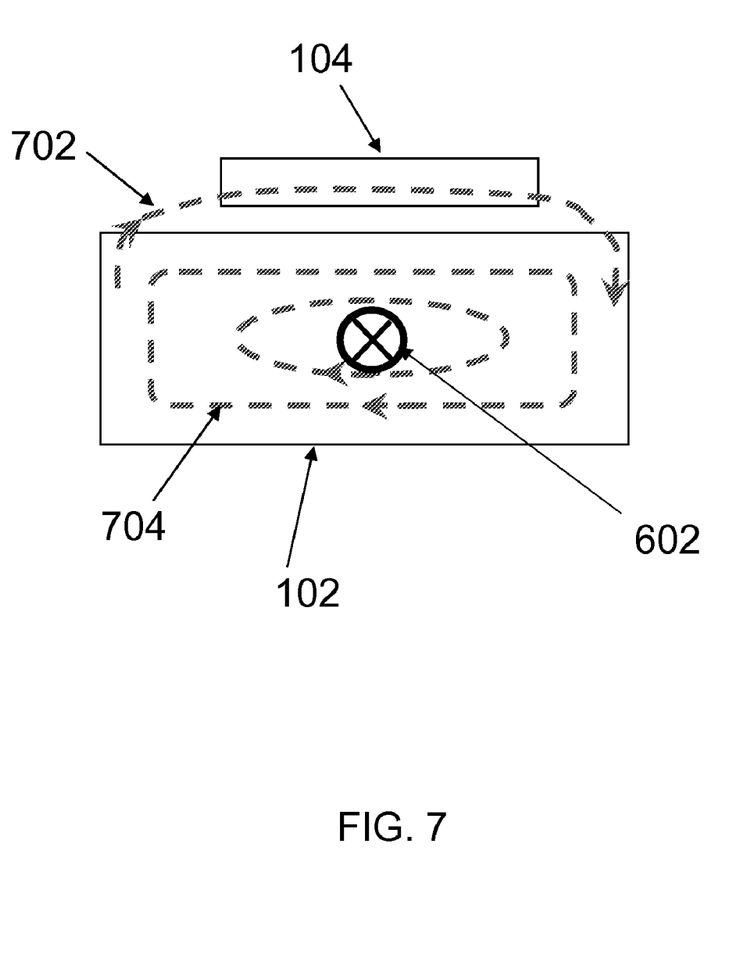
FIG. 7 is a diagram illustrating the magnetic fields created by the current illustrated in FIG. 6.

As illustrated in FIG. 6, a writing current 602 can flow in either direction along magnetic metal layer 102. As illustrated in FIG. 7, current 602 will create a magnetic field 704 within magnetic metal layer 102 and will also cause a magnetic field 702 to flow through magnetic sensing device 104. In FIG. 7, the current is shown flowing into the page creating clockwise magnetic field 702 and 704. The strength of the magnetic field 704 is proportional to the permeability value of magnetic metal layer 102 according to the Ampere's law. Thus, if the permeability of magnetic metal layer 102 is in the range of about $10^5$, then this means that the strength of magnetic field 704 would be $10^5$ times that produced conventionally via Ampere's law without magnetic metal layer 102.

On the other hand, due to shape confining, the magnetic field 704 close to the boundary of magnetic metal layer 102 would not form a circular loop inside magnetic metal layer 102. Rather, magnetic field 704 will leak from the surface of magnetic metal layer 102 to the outside. The relationship between leaked magnetic field 702 and magnetic field 704 inside the magnetic metal layer 102 follows a continuity equation. This means that the normal component magnetic fields of magnetic field 702 outside magnetic metal layer 102 and magnetic field 704 inside the magnetic metal layer 102 under the normal direction are same.

Amplified magnetic field 704 due to the high permeability of magnetic metal layer 102 will further cause to the high strength of magnetic field 702; however, the magnetic field outside should follow Ampere's law without the high permeability of magnetic metal layer 102, this means that the high strength of magnetic field 702 outside the magnetic metal layer is a localized field close to the surface of magnetic metal layer 102. The ranges of high magnetic field 702 should be several to several hundred nano-meters far away from the surface of magnetic metal layer 102. On the other hand, due to the $2^{nd}$ Maxwell equation, the diversion of the magnetic field will equal zero, the leaked magnetic field at the outside of magnetic metal layer 102 will also become a circular loop outside the magnetic metal layer 102. The circular path of magnetic field 702 goes through the magnetic sensing device 104 will cause to the magnetization reversal of active layer of magnetic sensing device 104. This further causes the resistance state to change from one to another.

Figure 8:
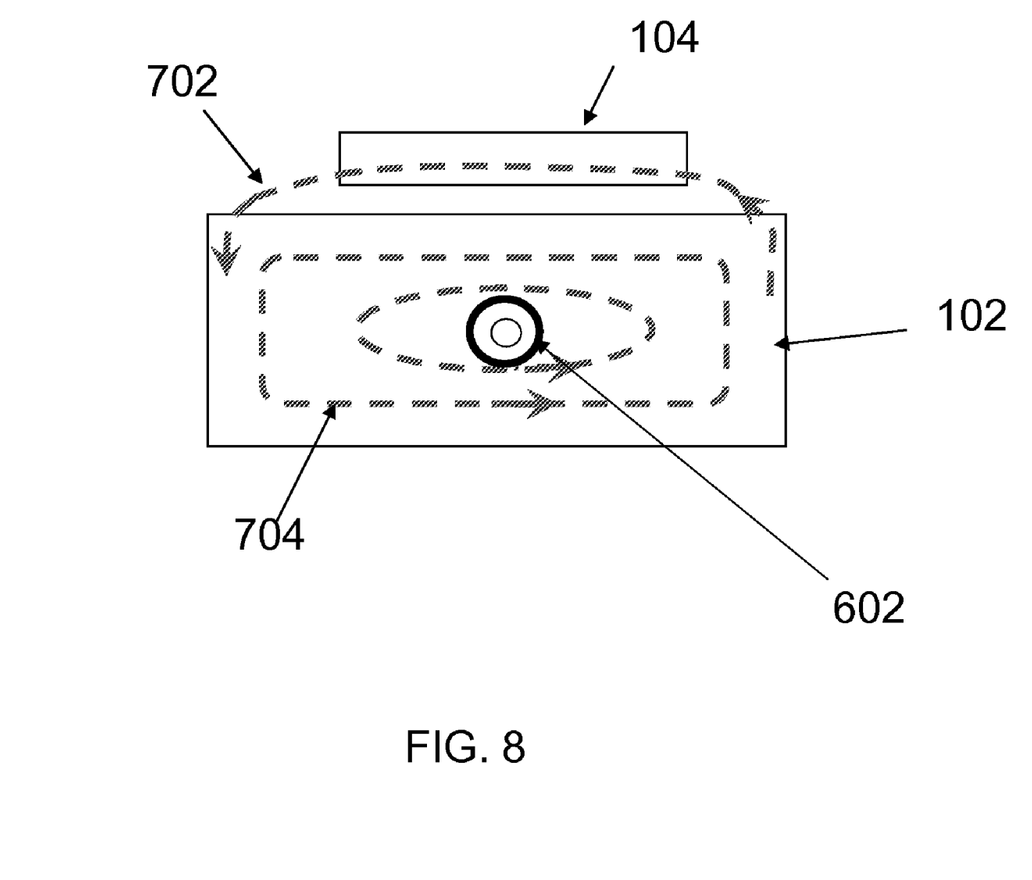
FIG. 8 is a diagram illustrating the magnetic fields created when the current illustrated in FIG. 6 is reversed.

In FIG. 8, current 602 is reversed such that it is coming out of the page, which creates counterclockwise magnetic field 704 within magnetic metal layer 102 and "leaked" magnetic field 702 within magnetic sensing device 104. Again, if the "leaked" field 702 is larger than the coercive field of magnetic sensing device 104 then programming can occur, this time to the opposite state that would result from magnetic field 702 illustrated in FIG. 7.

Using magnetic metal layer 102 to program magnetic sensing device 104 in this manner can significantly reduce, or even eliminate, cross talk between cells 100. Further, significantly lower currents are needed to create a sufficient magnetic field to overcome the coercive field of magnetic sensing device 104. For example a current of as little as 440 µA can generate a magnetic field 702 of 2,800 G; however, the magnetic field outside of a target cell 100 drops to almost zero with a log decay. As a result, using magnetic metal layer 102 in the manner described results in a low current, cross talk free MRAM cell 100.

In addition, only a single current line is needed to program magnetic sensing device 104 as opposed to two current lines as with conventional MRAM designs.

Figure 9:
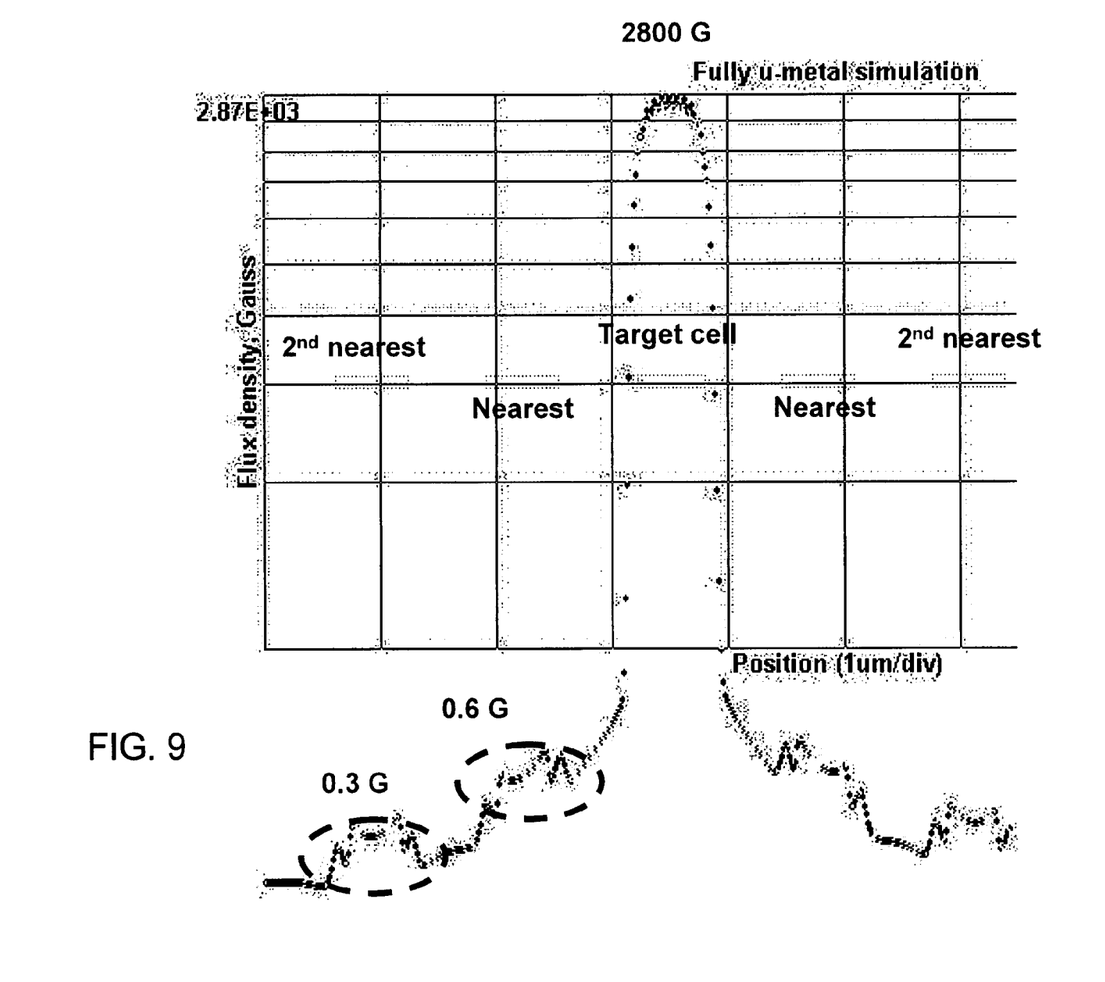
FIG. 9 is a diagram illustrating the simulated behavior of a memory cell as described herein by plotting the flux density as a function of position for cells separated less than 1 μm.

Referring to FIG. 9, shows the simulated behavior of a memory cell as described herein by plotting the flux density as a function of position for cells separated less than 1 µm. In the simulation, the permeability values for magnetic conducting line and the magnetic sensing device are 10000 and 5, respectively. The ferromagnetic layer of magnetic sensing device has the thickness and width of 60 nm and 0.6 µm, respectively. The width and thickness (height) of magnetic conducting line are 1.0 µm and 400 nm, respectively. The distance between magnetic sensing device and µ-metal was set at 60 nm. In another embodiment, the distance between magnetic sensing device and µ-metal is from 4 nm to 100 nm. The current applied is 440 µA. As the graph of FIG. 9 indicates, 440 µA current can generate B field of 2800 G at the surface of target cell. Thus, while the target cell experiences a strong magnetic field, neighbor cells experience very low magnetic cross-talking at other device.

Figure 10:
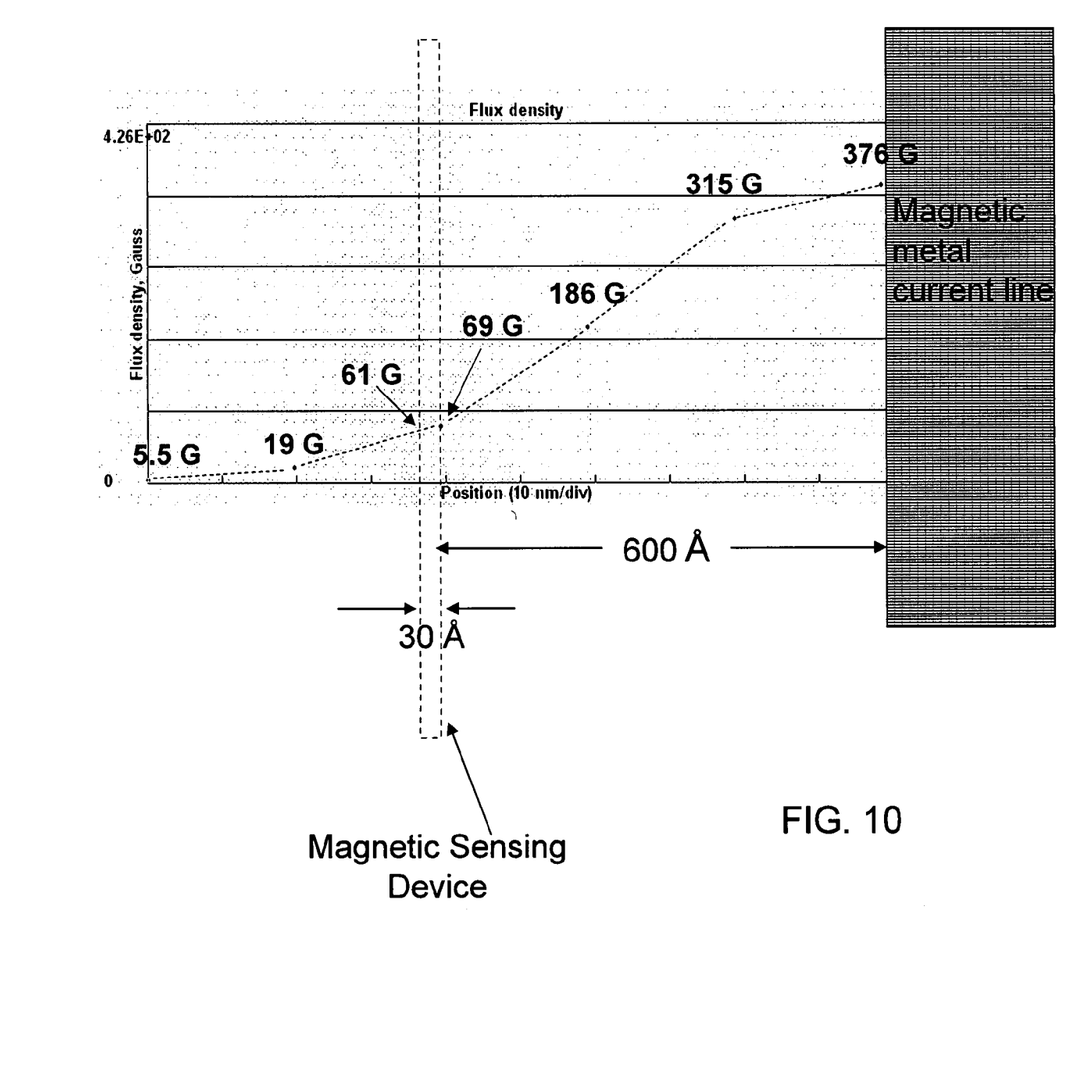
FIG. 10 is a diagram illustrating a simulation of the flux density as a function of position relative to the individual components of and exemplary memory cell.

FIG. 10 illustrates a simulation of the flux density as a function of position relative to the individual components of and exemplary memory cell. The ferromagnetic layer of magnetic sensing device has the thickness and width of 3 nm and 0.6 µm, respectively. The width and thickness (height) of magnetic conductor line are 1.0 µm and 400 nm, respectively. The distance between magnetic sensing device and magnetic conductor line is 60 nm. The current applied is 12 µA. The coercive field of magnetic sensing device is 50 G. FIG. 10 shows that over long distances (100 nm) far away from surface of magnetic conductive line, the magnetic field decreases sharply to a value in agreement with Ampere's law in air of 5.5 G.

As demonstrated above, embodiments of the invention provide a magnetic memory device and methods of storing data. First, the new MRAM device construction has better durability. Further, only one current carrying line is required to write to the device. Where desirable, lower writing currents can also be used to effectively store data compared with some other conventional devices and methods. Cross-talk is also reduce by certain embodiments. Thus, more devices can be placed in a smaller area without loss of signal or memory integrity. Other characteristics and additional advantages are apparent to those skilled in the art.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A nonvolatile memory device, comprising:
    a substrate;
    a relatively high permeability conductive element on the substrate comprising a cross section comprising a polygon shape and comprises a material having a permeability (µ) ranging from about 10 to $10^8$; and
    a magnetoresistive memory cell comprising a magnetic field, the magnetoresistive memory cell separated from the relatively high permeability conductive element by a non-magnetically conductive material and located in a region between neighboring two corners of the relatively high permeability conductive element, wherein the relatively high permeability conductive element is the only current line needed to change a direction of the magnetic field.

2. The nonvolatile memory device of claim 1, wherein the relatively high permeability conductive element is wider than the magnetoresistive memory cell.

3. The nonvolatile memory device of claim 1, comprising a plurality of nonvolatile memory devices, wherein each nonvolatile memory device comprises an individual relatively high permeability conductive element.

4. The nonvolatile memory device of claim 1, wherein the distance separating the relatively high permeability conductive element and the magnetoresistive memory cell is in the range of about 4 nm to about 100 nm.

5. The nonvolatile memory device of claim 1, wherein the relatively high permeability conductive element comprises a material that includes at least one of the Ni, Fe, Co, B, Mo, Zn, Pb, Si, C, and O.

6. The nonvolatile memory device of claim 1, wherein the relatively high permeability conductive element comprises a material having resistivity ($\rho$) ranging from about 4 $\mu\Omega$-cm to $10^8$ $\mu\Omega$-cm at operating temperatures.

7. The nonvolatile memory device of claim 1, wherein the relatively high permeability conductive element comprises a material having a saturation magnetization ($M_s$) ranging from about 10 Guass to about 2.5 Tesla.

8. The nonvolatile memory device of claim 1, wherein the relatively high permeability conductive element comprises a material having a permeability ($\mu$) ranging from about 10 to $10^8$ and a resistivity ($\rho$) ranging from about 4 $\mu\Omega$-cm to $10^8$ $\mu\Omega$-cm at operating temperatures.

9. The nonvolatile memory device of claim 8, wherein the relatively high permeability conductive element comprises a material having a saturation magnetization ($M_s$) ranging from about 10 Guass to about 2.5 Tesla.

10. The nonvolatile memory device of claim 1, wherein the magnetoresistive memory cell comprises a Magnetic Tunnel Junction (MTJ) device, a Giant Magnetoresistance (GMR) device, a Colossal Magnetoresistance (CMR) device, Anisotropic Magnetoresistance (AMR) device, Magneto-optical (MO) element, or a Magnetic disk.

11. The nonvolatile memory device of claim 10, wherein the MTJ device comprises a first ferromagnetic layer, an insulating layer, and a second ferromagnetic layer.

12. The nonvolatile memory device of claim 11, wherein the MTJ device further comprises an antiferromagnetic layer adjacent the first or second ferromagnetic layer.

13. The nonvolatile memory device of claim 11, wherein the insulator of MTJ device can be Al2O3 or MgO.

14. The nonvolatile memory device of claim 10, wherein the GMR device comprises a first ferromagnetic layer, a thin conductive layer, and a second ferromagnetic layer.

15. The nonvolatile memory device of claim 14, wherein the GMR device further comprises an antiferromagnetic layer adjacent the first or second ferromagnetic layer.

16. A magnetoresistive memory device, comprising:
a non-magnetically electrically conductive material;
a relatively high permeability element comprising a cross section including a polygon shape and configured to directly generate a magnetic field in response to an applied current, wherein the leakage magnetic field from a position close to a corner of the relatively high permeability element has a strength that is the same order of magnitude as the strength of the magnetic field within the relatively high permeability element; and
a magnetoresistive memory element comprising a magnetic field, the magnetoresistive element being adjacent to the relatively high permeability element, wherein the magnetoresistive memory element and the relatively high permeability element are separated by the non-magnetically electrically conductive material, and wherein the relatively high permeability element is the only current line needed to change a direction of the magnetic field.

17. The magnetoresistive memory device of claim 16, wherein the relatively high permeability conductor comprises a material having a permeability ($\mu$) ranging from about 10 to $10^8$.

18. The magnetoresistive memory device of claim 16, wherein the relatively high permeability conductor comprises a material includes Ni, Fe, Co, B, Mo, Zn, Pb, Si, C, O, and combinations thereof.

19. The magnetoresistive memory device of claim 16, wherein the relatively high permeability conductor comprises a material having resistivity ($\rho$) ranging from about 4 $\mu\Omega$-cm to $10^8$ $\mu\Omega$-cm at operating temperatures.

20. The magnetoresistive memory device of claim 16, wherein the relatively high permeability conductor comprises a material having a saturation magnetization ($M_s$) ranging from about 10 Guass to about 2.5 Tesla.

21. The magnetoresistive memory device of claim 16, wherein the relatively high permeability conductor comprises a material having a permeability ($\mu$) ranging from about 10 to $10^8$ and a resistivity ($\rho$) ranging from about 4 $\mu\Omega$-cm to $10^8$ $\mu\Omega$-cm at operating temperatures.

22. The magnetoresistive memory device of claim 16, wherein the relatively high permeability conductor comprises a material having a saturation magnetization (Ms) ranging from about 10 Guass to about 2.5 Tesla.

23. The magnetoresistive memory device of claim 16, wherein the magnetoresistive memory element comprises a Magnetic Tunnel Junction (MTJ) device, a Giant Magnetoresistance (GMR) device, a Colossal Magnetoresistance (CMR) device, Anisotropic Magnetoresistance (AMR) device, Magneto-optical (MO) element, or a Magnetic disk.

24. The magnetoresistive memory device of claim 23, wherein the MTJ device comprises a first ferromagnetic layer, an insulating layer, and a second ferromagnetic layer.

25. The magnetoresistive memory device of claim 23, wherein the MTJ device further comprises an antiferromagnetic layer adjacent the first or second ferromagnetic layer.

26. The magnetoresistive memory device of claim 24, wherein the insulating layer of MTJ device can be Al2O3 or MgO.

27. The magnetoresistive memory device of claim 23, wherein the GMR device comprises a first ferromagnetic layer, a thin conductive layer, and a second ferromagnetic layer.

28. The magnetoresistive memory device of claim 27, wherein the GMR device further comprises an antiferromagnetic layer adjacent the first or second ferromagnetic layer.

* * * * *

UNITED STATES PATENT AND TRADEMARK OFFICE
CERTIFICATE OF CORRECTION

PATENT NO. : 7,352,613 B2  
APPLICATION NO. : 11/255606  
DATED : April 1, 2008  
INVENTOR(S) : ChiaHua Ho et al.

Page 1 of 1

It is certified that error appears in the above-identified patent and that said Letters Patent is hereby corrected as shown below:

Column 10, Line 7, Claim 17, delete "conductor" and insert in lieu thereof
-- element --

Column 10, Line 11, Claim 18, delete "conductor" and insert in lieu thereof
-- element --

Column 10, Line 15, Claim 19, delete "conductor" and insert in lieu thereof
-- element --

Column 10, Line 19, Claim 20, delete "conductor" and insert in lieu thereof
-- element --

Column 10, Line 23, Claim 21, delete "conductor" and insert in lieu thereof
-- element --

Column 10, Line 28, Claim 22, delete "conductor" and insert in lieu thereof
- element --

Signed and Sealed this

Tenth Day of March, 2009

JOHN DOLL  
*Acting Director of the United States Patent and Trademark Office*